United States Patent [19]

Loewenstein et al.

[11] Patent Number: 5,002,632

[45] Date of Patent: Mar. 26, 1991

[54] METHOD AND APPARATUS FOR ETCHING SEMICONDUCTOR MATERIALS

[75] Inventors: Lee M. Loewenstein, Plano; Douglas A. Webb, Allen, both of Tex.

[73] Assignee: Texas Instruments Incorporated, Dallas, Tex.

[21] Appl. No.: 441,134

[22] Filed: Nov. 22, 1989

[51] Int. Cl.$^5$ .......................... B44C 1/22; C23F 1/02; C03C 15/00; C03C 25/06
[52] U.S. Cl. .................................. 156/643; 156/646; 156/656; 156/659.1; 156/345; 204/192.35; 252/79.1; 437/245
[58] Field of Search .............. 156/643, 646, 656, 657, 156/659.1, 662, 345; 252/79.1; 427/38, 39; 437/228, 245, 246; 204/192.32, 192.35, 192.37, 298

[56] References Cited

U.S. PATENT DOCUMENTS

| | | | |
|---|---|---|---|
| 4,615,756 | 10/1986 | Tsujii et al. | 156/345 |
| 4,668,337 | 5/1987 | Sekine et al. | 156/345 |

*Primary Examiner*—William A. Powell
*Attorney, Agent, or Firm*—James C. Kesterson; James T. Comfort; Melvin Sharp

[57] ABSTRACT

An apparatus and method for the etching of semiconductor materials (14) is disclosed. The apparatus (10) includes a process chamber (12) having a remote generator (16) in fluid communication with the process chamber (12) for converting a noble gas (34) to a metastable gas (36). An etchant gas (40) is subsequently brought into the chamber (12) adjacent to the material (14), to mix and react with the metastable gas (36) at activation zone (38). The metastable gas (36) collides with the etchant gas (40) to cause the mixture to selectively etch the material 14.

11 Claims, 1 Drawing Sheet

METHOD AND APPARATUS FOR ETCHING SEMICONDUCTOR MATERIALS

RELATED APPLICATIONS

This application is related to co-pending U.S. Pat. application Ser. No. 07/355,942(TI-14043) entitled, "Method for Etching Semiconductor Materials", by Jucha, et al., filed May 23, 1989.

TECHNICAL FIELD OF THE INVENTION

The present invention relates to a method and apparatus for manufacturing integrated circuits and other electronic devices. More particularly, the invention relates to an improved method and apparatus for etching semiconductor materials.

BACKGROUND OF THE INVENTION

When fabricating integrated circuits, a plurality of films are deposited onto a wafer. These films are selectively patterned, etched, doped, reacted, etc. to provide the desired functions for electronic devices. The patterning process can use a variety of well-known pattern transfer methods (e.g., using a pattern mask to transfer an image to the deposit film). After the deposited film is covered with a patterned mask, such as a photoresist layer, the exposed portion of the deposited film can then be removed.

Etching processes are used extensively in semiconductor manufacturing to remove exposed portions of the deposited film. One etching process that can be used to remove the exposed film is dry, or RF-plasma assisted, etching which uses plasma in the form of a low pressure gaseous discharge. This etching process provides a high fidelity transfer of resist patterns.

In some instance, etchant species are activated outside of the process chamber where the deposited film may potentially be damaged by plasma generated within the process chamber. When this excitation is provided outside of the process chamber, the process may be referred to as either after-glow, downstream or remote plasma etching. If additional excitation is required, it can be accomplished in the process chamber.

Defects are caused by the presence of particulates on a surface of the process materials. This is one of the reasons for the switch from wet etches to dry etches. Under certain conditions, however, remote plasma-etching can create particulates that are generated and carried to the surface of the etchant stream, thereby contaminating the surface of the process material.

One variety of remote plasma-etching activates the etchant by passing it through a microwave cavity. The process gases, including the etchant, flow through a discharge tube formed from a relatively inert insulating material (e.g., quartz) which passed through a microwave cavity. These activated process gases, in combination with high temperatures, can etch the internal surfaces of the quartz discharge tube, creating quartz particulates. Unfortunately, these generated quartz particulates are passed through process stream, to the face of the surface, and inevitably cause contamination to the surface of the semiconductor material.

Thus, there is a need for a remote plasma-etching process which does not contaminate the surface being processed. Consequently, it is desirable to activate the etchant, as close as possible to the surface of the wafer being etched, to eliminate any contamination caused when passing the activated gas through the quartz tubes of the process. Additionally, increased selectivity of activating the etchant would increase the control over the etching of the semiconductor materials.

SUMMARY OF THE INVENTION

The present invention provides an apparatus and method for etching through films on semiconductor wafers. One aspect of the present invention is an apparatus having a process chamber for holding the semiconductor material during the etching process. Initially, a generator remote from and in fluid communication with the process chamber is used to produce a metastable gas from an inlet noble gas or other gas species which can achieve a metastable state upon excitement. In its operation, the metastable gas will achieve a specific energy level upon excitement. This metastable gas is transferred to the chamber near an activation zone which is adjacent to the surface of the wafer. An etchant precursor source, having an etchant gas contained therein and in fluid communication with the process chamber, supplies the etchant gas for the process chamber near the activation zone to mix and react with the metastable gas for selectively etching the semiconductor material.

The generator of the present invention generally comprises an inlet tube for injecting noble gas or other source of metastable species into a discharge tube contained within the generator. Once the noble gas has been excited and converted to a metastable gas, an outlet tube carries the gas out of the discharge tube and to the process chamber for reaction with the etchant gas.

In an alternative embodiment, the metastable gas and the etchant gas are mixed in an activation zone prior to injection into the process chamber. In its preferred embodiment, the metastable gas is argon and the etchant gas is $SF_6$. Additionally, the discharge tube of the generator is composed of a quartz material.

The present invention presents technical advantages over prior dry etching techniques. This novel invention uses a remote microwave system for exciting a metastable gas which activates an etchant gas to produce free radicals used to selectively etch semiconductor material. The present invention also presents increased throughput, process simplifications, and the ability to operate without damaging the quartz tube. Additionally, the invention present technical advantages due to its capabilities of selectively activating noble gases and converting them into metastable gases.

BRIEF DESCRIPTION OF THE DRAWINGS

Other aspects of the invention and their advantages may be appreciated with reference to the following Detailed Descriptions taken in conjunction with the appended Drawings in which.

DETAILED DESCRIPTION OF THE INVENTION

Figure 1:
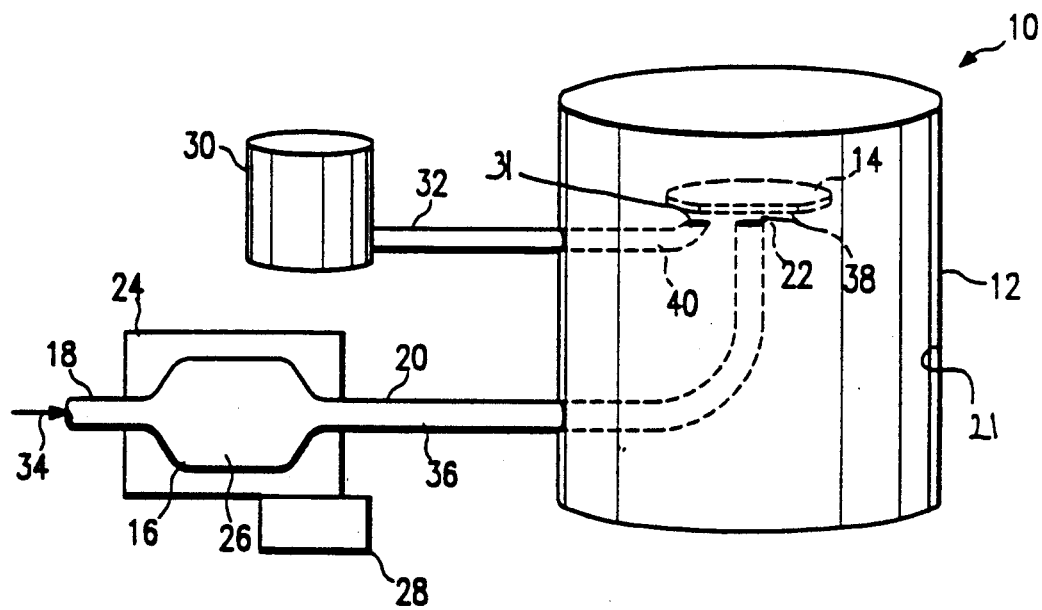
FIG. 1 is a schematic diagram of an etching apparatus according to the present invention.

FIG. 1 is a schematic view of the apparatus of the present invention, generally designated 10. Apparatus 10 comprises a process chamber 12 having a wafer 14 contained therein. Wafer 14 may be composed of a plurality of materials, such as tungsten deposited onto a silicon substrate, or other materials generally used in integrated circuit manufacturing. Connected to chamber 12 is a generator 16. Generator 16, generally, comprises an inlet line 18 and an outlet line 20. Outlet line 20 is used to interconnect generator 16 to chamber 12. Outlet line 20 is disposed through a sidewall 21 of chamber 12 and has an opening 22 contained within chamber 12 in the general proximity as wafer 14.

Generator 16 has a resonant cavity 24 for containing a discharge tube 26 therein. Coupled to resonant cavity 24 is a magnetron device 28 which operates at 2.45 $GH_z$. Also connected to chamber 12 is an etchant vessel 30. Etchant chamber 30 has an outlet line 32 for interconnecting vessel 30 to chamber 12. Outlet line 32 extends through sidewall 21 of chamber 12 and has a terminal opening 31 near wafer 14.

In operation, a noble gas 34 enters line 18 and accumulates within discharge tube 26. Magnetron device 28 is activated to excite noble gas 34 within tube 26. This excitement of noble gas 34 causes the gas to increase in energy level and to convert to a metastable gas 36. This metastable gas 36 varies in energy level, depending upon the initial noble gas used for the particular process. Metastable gas 36 passes through outlet tube 20 to chamber 12. Metastable gas 36 eventually exits outlet opening 22 within chamber 12.

Excitation of noble gas to metastable gas for inducing the chemical reaction generally follows the mechanism illustrated below:

$$R(np^6) \rightarrow^{e^-} R(np^5(n+1)s^1) = R^*,$$

where R is an inert atom such as a noble gas or a metal. As can be seen, after exciting R, an electron (e) is excited from its p-orbital to a higher energy s-orbital to create an atom in its metastable state. Typical energy levels for noble gases are set forth below:

| He | Ne | Ar | Kr | Xe | Rn |
|---|---|---|---|---|---|
| 489.2 | 384.4 | 268.0 | 231.4 | 194.5 | 160.1 |
|  | 388.5 | 272.8 | 245.4 | 220.7 | 248.8 | in units of kcal per einstein.

While noble gas 34 is being converted into a metastable gas 36, an etchant precursor 40, contained within etchant vessel 30, is brought through etchant line 32 to an activation zone 38. Activation zone 38 is generally the area within the immediate vicinity of both outlet opening 22 and wafer 14. In accordance with the present invention, etchant gas 40 is cracked by metastable gas 36 at activation zone 38 to cause the etchant to selectively etch the surface of wafer 14.

A typical reaction mechanism can be illustrated by the following:

$$CF_4 + M^* \longrightarrow CF_3 + F + M$$
$$\text{and}$$
$$CF_2 + 2F + M,$$

where M* is a metastable gas.

The excitation of etchant gas 40 is performed adjacent to wafer 14 to eliminate any damage to tube 26, tube 20 or chamber 12. The positioning of activation zone 38 reduces the extent of particulates within chamber 12. Accordingly, the reduction of particulates in chamber 12 reduces the extent of contamination on the surface of wafer 14.

Figure 2:
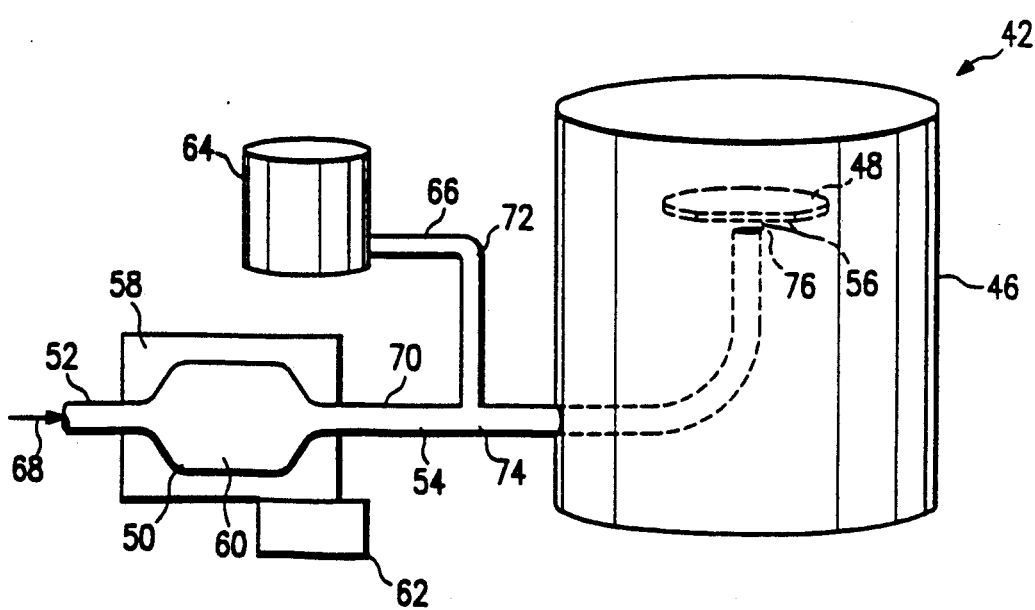
FIG. 2 is a schematic diagram of an alternative etching apparatus according to the present invention.

Referring to FIG. 2, an alternative embodiment of the present invention can be seen. This alternative embodiment is generally designated at 42. Apparatus 42 includes a process chamber 46 having a wafer 48 contained therein. Chamber 46 is connected to a generator 50 by a generator outlet line 54. Generator 50 includes an inlet line 54 for the introduction of noble gas. The outlet line 54 has an opening 76 at its end. Generator 50 has a resonant cavity 58 for containing a discharge tube 60 therein which excites the gas prior to entering process chamber 46. Generator 50 has a magnetron device 62 connected to resonant cavity 58 for activating the gas, which then enters chamber 46. An etchant line 66 has one end opening onto the interior of line 54. Lines 54 and 66 form an activation zone 74 at their intersection. Etchant line 66 leads from an etchant supply vessel 64 having an etchant gas 72 contained therein.

In the operation of the embodiment shown in FIG. 2, a noble gas 68 enters through inlet line 52 and moves into discharge tube 60. While noble gas 68 accumulate in discharge tube 60, magnetron device 62 is activated to excite noble gas 68 and convert it to a metastable gas 70. Metastable gas 70 is carried through outlet line 54 to 70, just outside of chamber 46. An etchant gas 72 is transferred from etchant chamber 54, through etchant line 66, and to activation zone 74. At activation zone 74, metastable gas 70 and etchant gas 72 are mixed and reacted to create the necessary etchant to eventually etch wafer 48. Activated gases 70 and 72 are transferred through line 54, to opening 64 and then to etch wafer 48, within chamber 46. In this alternative embodiment, outlet line 54 is utilized as both a transfer line and an activation chamber.

In accordance with the present invention, metastable gas 36 is created by selectively energizing a predetermined noble gas 34. It has been found that by choosing a particular metastable gas 36, the fraction of etching species is dependent on the specific energy of metastable gas 36. In other words, an etchant, such as a gaseous flourine-bearing compounds, can be selectively energized by metastable gas 36 to controllably etch wafer 14. The mechanism of this reaction is controlled by physicochemical properties of the constituents. Accordingly, when metastable gas 36 collides with etchant gas 40, the collision energy breaks apart the chemical bonds of etchant gas 40 which activate the free-radicals necessary for etching through wafer 14. One feature, of the present invention, is the ability to select a metastable gas having a specific energy level capable of selectively breaking the chemical bonds of a particular etchant gas. An example of such selectively is provided below:

EXAMPLE

A silicon nitride film was etched, using argon gas, at a rate of 65 sccm and $SF_6$ at 50 sccm. The argon gas was excited by a magnetron generator operating at 2450 MHz. The chamber operating conditions were set at a pressure of 0.45 torr and a temperature of 200° C. This particular combination resulted in an etch that was both anisotropic and selective. The etch rates and selectivities were controlled by varying the microwave power and by adding RF power in the process chamber. Rates can be modified by varying the temperature, pressure and gas mixtures.

The present invention presents technical advantages over the prior art because it eliminates the destruction of the quartz tube. Additionally, the present invention reduces the extent of particulate production caused by the destruction of the outlet tube during process. Additionally, because the noble gas can be selected, according to this particular application, there is an increased extent of etching selectivity.

While the preferred embodiment of the present invention and its advantages has been disclosed in the above-detailed description, the present invention is not limited thereto, but only by the spirit and scope of the appended claims.

What is claimed is:

1. An apparatus for etching semiconductor material, comprising:
    a process chamber for holding the semiconductor material during etching;
    a generator remote from and in fluid communication with the process chamber for producing a metastable gas from a noble gas; and
    an etchant precursor source having an etchant contained therein and in fluid communication with the process chamber for supplying said etchant to mix and react with said metastable gas prior to entering the process chamber for selectively etching the semiconductor material.

2. The apparatus as recited in claim 1, wherein said generator comprises:
    an inlet tube;
    a discharge tube in fluid communication with said inlet tube;
    an excitation cavity surrounding said discharge tube; and
    an outlet tube in fluid communication with said discharge tube and said process chamber.

3. The apparatus as recited in claim 2, wherein said outlet tube is formed of quartz.

4. The apparatus as recited in claim 1, wherein said noble gas is selected from a group consisting of helium, neon, argon, krypton, xenon, and radon.

5. The apparatus as recited in claim 1, wherein said etchant gas is a fluorine-bearing compound.

6. A method for etching a surface of an integrated circuit workpiece in a process chamber, comprising the steps of:
    exciting a noble gas in a remote generator to create a metastable gas;
    flowing said metastable gas through an outlet tube and in fluid connection with the process chamber; and
    injecting an etchant precursor into the process chamber to react with said metastable gas for etching the surface of an integrated circuit workpiece composed of tungsten.

7. A method for manufacturing an etchant for etching an electronic device, comprising the steps of:
    exciting a noble gas to convert to a metastable gas in a discharge tube;
    flowing said excited metastable gas through an outlet tube in fluid communication with a process chamber; and
    forming an etchant from an etchant precursor compound gas with the excited metastable gas in the outlet tube before said metastable gas and said etchant gases flow into said process chamber.

8. The method as recited in claim 7, wherein said electronic device is made of tungsten.

9. The method as recited in claim 7, wherein said etchant gas is fluorine-bearing compound.

10. The method as recited in claim 7, wherein said noble gas is selected from group consisting of argon, helium, neon, krypton, xenon, radon and mixture thereof.

11. The method as recited in claim 7, further including activating the etchant gas prior to mixing with said metastable gas.

* * * * *